United States Patent [19]
Lin et al.

[11] Patent Number: 5,777,369
[45] Date of Patent: Jul. 7, 1998

[54] BIT-LINE PULL-UP CIRCUIT OR STATIC RANDOM ACCESS MEMORY (SRAM) DEVICES

[75] Inventors: Shi-Tron Lin, Taipei; Ming-Tsan Yeh, Hsinchu; Chau-Neng Wu, Fen Shan; Chi-Hsi Wu, Taichung, all of Taiwan

[73] Assignee: Winbond Electronics Corporation, Taiwan

[21] Appl. No.: 778,264

[22] Filed: Jan. 2, 1997

[30] Foreign Application Priority Data

Jul. 16, 1996 [TW] Taiwan .................... 85108585

[51] Int. Cl.$^6$ .................... H01L 29/76; H01L 29/94; H01L 31/062; H01L 31/113
[52] U.S. Cl. .................... 257/368; 257/390; 257/903
[58] Field of Search .................... 257/368, 316, 257/371, 390, 382, 774, 903

[56] References Cited

U.S. PATENT DOCUMENTS

| | | |
|---|---|---|
| 5,124,774 | 6/1992 | Godinho et al. ............ 257/381 |
| 5,227,665 | 7/1993 | Nakamura et al. .......... 257/368 |
| 5,241,205 | 8/1993 | Shimizu et al. ............ 257/368 |
| 5,336,914 | 8/1994 | Andoh ..................... 257/368 |
| 5,508,564 | 4/1996 | Lee et al. ................. 257/774 |
| 5,534,724 | 7/1996 | Nagamine ................. 257/390 |

FOREIGN PATENT DOCUMENTS 63-179576   7/1988   Japan .................... 257/368

Primary Examiner—Sara W. Crane
Assistant Examiner—Phat X. Cao
Attorney, Agent, or Firm—Rabin & Champagne, P.C.

[57] ABSTRACT

A bit-line pull-up circuit for an SRAM device which utilizes an improved diffusion structure for enhanced immunity of the SRAM device against electrostatic discharge. The improved diffusion structure includes an undivided diffusion region that serves as a common drain for a plurality of MOS transistors. The undivided diffusion region has at least a pair of recessed diffusion edges formed on opposite sides thereof. The forming of the recessed diffusion edges prevents the so-called electrical field crowding effect and also enhances ESD immunity for the MOS transistor. Further, since the drain diffusion region is an undivided area, an increased number of metal contact windows are provided therein, and at least one of the metal contact windows is arranged substantially between the two recessed diffusion edges. In the event of an electrostatic discharge, this allows the discharge current flowing into the drain to be divided into a greater number of small-magnitude currents flowing to the source.

21 Claims, 6 Drawing Sheets

BIT-LINE PULL-UP CIRCUIT OR STATIC RANDOM ACCESS MEMORY (SRAM) DEVICES

BACKGROUND OF THE INVENTION

1. Field of the Invention

The invention relates to methods for fabricating semiconductor devices, and more particularly, to a bit-line pull-up circuit utilizing an improved diffusion structure for enhanced immunity of the SRAM devices against electrostatic discharge (ESD).

2. Description of the Related Art

In electronics, the discharge of static electricity from an outside source into the circuitry of an integrated circuit (IC) device, for example an SRAM device, has the potential to damage the SRAM device. ESD protection circuits are thus provided in the SRAM device for protection of the same by diverting the discharge current via pull-up or pull-down diodes to power buses when electrostatic stress is applied to the I/O ports of a SRAM device. However, as a consequence of the power bus receiving the diverted discharge current, some internal parasitic devices in the SRAM device can be turned on and thereby override the ESD protection circuit. These parasitic devices are the so-called weak spots in the internal circuit of the SRAM device. The causes of these weak spots are found to be related to several particular arrangements of the circuit elements in the SRAM device as listed in the following:

(1) The connection of n+diffusion region to $V_{DD}$, thus forming an $n^+/p$ well diode between power rails;

(2) The connection of p+diffusion region to $V_{SS}$, thus forming a $p^+/n$ well diode between power rails;

(3) The connection of one n+diffusion region $V_{DD}$ adjacent to another $n^+$diffusion region that is connected to $V_{SS}$, thus forming a parasitic NPN bipolar transistor between power rails; and (4) The connection of one $p^+$-type diffusion region to $V_{DD}$ adjacent to another $p^+$-type diffusion region that is connected to $V_{SS}$, thus forming a parasitic PNP bipolar transistor between power rails.

Since the internal circuit of a conventional SRAM device is designed in accordance with so-called minimum design rules in order to provide sufficient component density, not much space is provided between the metal contact windows and the diffusion regions and between the metal contact windows and the gate layers. As a consequence, the conventional SRAM device is easily damaged by transient currents caused by electrostatic discharge.

Referring to FIG. 1, there is shown a plan view of the circuit layout of a conventional bit-line pull-up circuit for an SRAM device, including four bit lines BL11, BL12, BL13, BL14. This bit-line pull-up circuit is used to set the bit lines BL11, BL12, BL13, BL14 to a common positive voltage to enable quick response of sense amplifiers (not shown) coupled to these bit lines. The bit-line pull-up circuit includes a pair of gate layers 18a, 18b and at least two $n^+$diffusion regions 15a, 15b. The gate layers 18a, 18b are respectively connected to the power buses VG1 and VG2 which are connected to a common control gate potential (in other words, VG1=VG2 all the time). The $n^+$diffusion region 15a and the gate layers 18a, 18b together define a pair of N-type MOS transistors, and the $n^+$diffusion region 15b and the gate layers 18a, 18b together define another pair of N-type MOS transistors. A pair of metal contact windows 16a, 17a is used to electrically connect the $n^+$diffusion region 15a to the $V_{DD}$ power bus, and another pair of metal contact windows 16b, 17b is used to electrically connect the $n^+$diffusion region 15b to the same $V_{DD}$ power bus. This arrangement causes a plurality of $n^+/p$ well diodes (not shown) to form in the SRAM device. During an electrostatic discharge, if the transient high voltage between the power buses $V_{DD}$ and $V_{SS}$ causes these diodes to breakdown, the discharge current flowing through the diodes will raise the temperature in the junction between the diodes and the $n^+$diffusion regions 15a, 15b. In this case, if the metal contact windows 16a, 17a, 16b, 17b are arranged very proximate to the $n^+$diffusion regions 15a, 15b, the metal in the metal contact windows 16a, 17a, 16b, 17b could easily be heated to above its melting point. For example, the melting temperature of the aluminum layer in the diffusion regions is only about 550° C. The high temperature caused by the discharge current to the aluminum layer could cause the undesired effects of spiking in the aluminum layer and current leakage in the metal contact windows 16a, 17a, 16b, 17b. Therefore, to prevent these undesired effects, the metal contact windows 16a, 17a, 16b, 17b should be separated from the $n^+$diffusion regions 15a, 15b by a suitable distance. However, this solution limits the number of metal contact windows that can be provided in the drain diffusion region. In other words, the circuit layout shown in FIG. 1 leaves the internal circuit of the SRAM device very susceptible to electrostatic discharge current flowing through the metal contact windows.

SUMMARY OF THE INVENTION

It is therefore an object of the invention to provide a bit-line pull-up circuit for an SRAM device which utilizes an improved diffusion structure for enhanced immunity of the SRAM device against electrostatic discharge.

In accordance with the foregoing and other objects of the invention, a new and improved bit-line pull-up circuit for an SRAM device is provided. The bit-line pullup circuit includes a drain diffusion region, a number of metal contact windows for electrically connecting the drain diffusion region to the power bus, a plurality of source diffusion regions, and at least a pair of gate layers. The drain diffusion region, the gate layers, and the source diffusion regions in combination form a number of MOS transistors, in which the drain diffusion region serves as a common drain for the MOS transistors. The drain diffusion region is formed with at least a pair of recessed diffusion edges on opposite sides thereof. The gate layers are connected to a control voltage bus. The source diffusion regions are connected to respective bit lines of the SRAM device.

In the foregoing circuit layout, the drain diffusion area is an undivided diffusion region that serves as a common drain for a number of MOS transistors and is formed with a pair of recessed diffusion edges on opposite sides thereof. The recessed diffusion edge formation prevents the so-called electrical field crowding effect and also enhances the ESD immunity of the MOS transistor.

Further, since the drain diffusion region is an undivided area, a greater number of metal contact windows can be provided therein and, of these metal contact windows, at least one is arranged substantially between the two recessed diffusion edges. During an electrostatic discharge, the discharge current flowing into the drain divides into a number of small-magnitude currents flowing to the source. The SRAM device is thus enhanced in its ESD immunity.

BRIEF DESCRIPTION OF DRAWINGS

The invention can be more fully understood from the following detailed description of thereferred embodiments, with reference made to the accompanying drawings, wherein:.

DETAILED DESCRIPTION OF PREFERRED EMBODIMENTS

Figure 2:
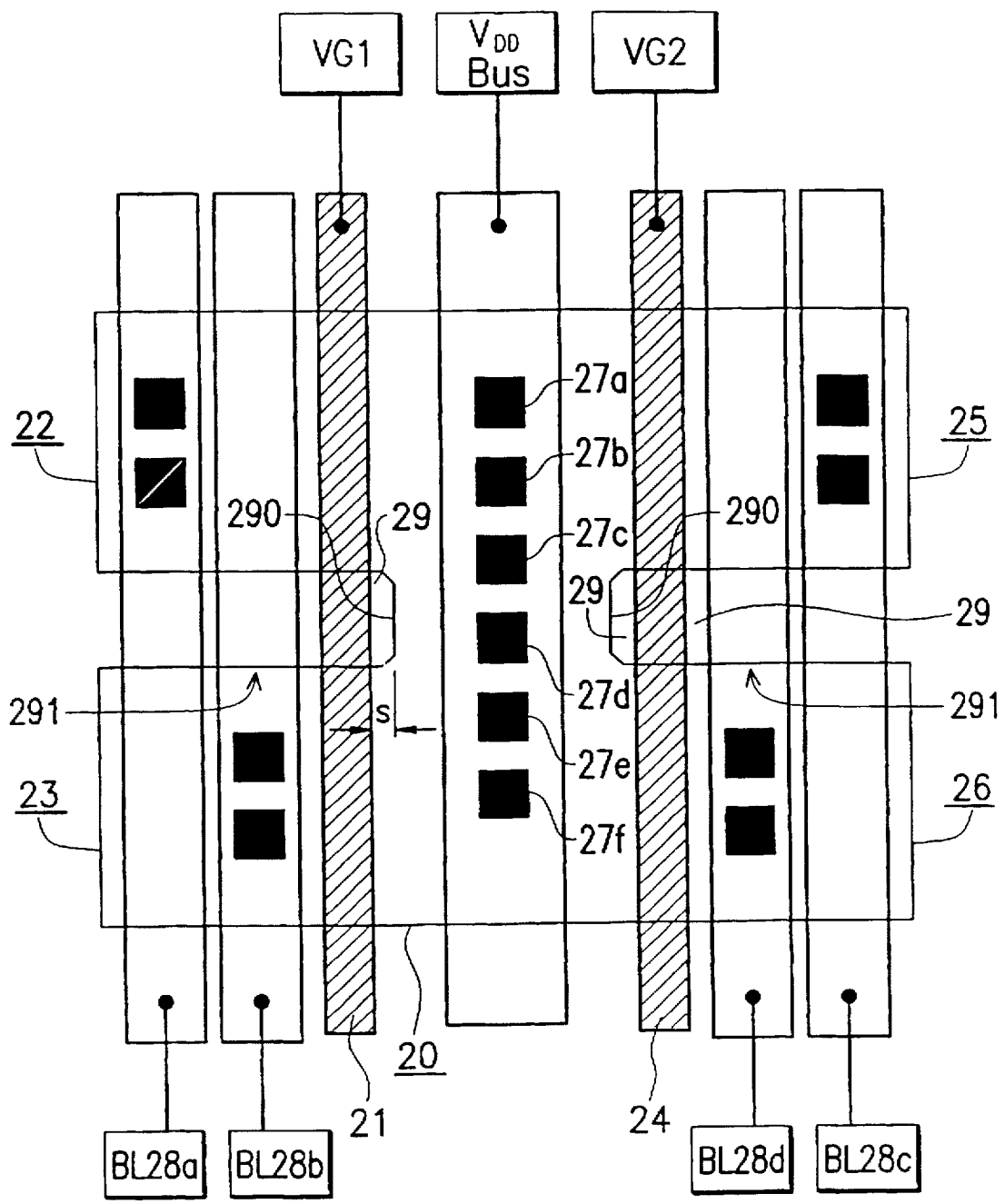
FIG. 2 is a plan view of a circuit layout of a first preferred embodiment of the bit-line pull-up circuit according to the invention.

Referring to FIG. 2, there is shown a plan view of a circuit layout of a first preferred embodiment of the bit-line pull-up circuit according to the invention. A plurality of N-type SRAMs are used for control of the bit-line pull-up circuit, each including one gate, an $n^+$-diffusion region connected to $V_{DD}$, and another $n^+$-diffusion region connected to one bit line. A plurality of bit lines BL28a, BL28b, BL28c, and BL28d are formed on the wafer. In addition, the circuit layout of FIG. 2 includes one drain diffusion region 20, four source diffusion regions 22, 23, 25, 26, and two prolonged gate layers 21, 24. In this bit-line pull-up circuit, the drain and source diffusion regions 20, 22, 23, 25, 26 are all $n^+$-type diffusion regions. These elements define four N-type MOS transistors, the channels of which are controlled by potentials applied to the gate layers 21, 24. That is, the drain diffusion region 20, the gate layer 21, and the upper-left source diffusion region 22 in combination form a first N-type MOS transistor; the drain diffusion region 20, the gate layer 21, and the lower-left source diffusion region 23 in combination form a second N-type MOS transistor; the drain diffusion region 20, the gate layer 24, and the upper-right source diffusion region 25 in combination form a third N-type MOS transistor; and the drain diffusion region 20, the gate layer 24, and the lower-right source diffusion region 26 in combination form a fourth N-type MOS transistor.

The drain diffusion region 20 (which is called common $V_{DD}$-connected $n^+$diffusion region) is electrically connected to a power bus $V_{DD}$ by means of a plurality of metal contact windows 27a, 27b, 27c, 27d, 27e, 27f. The upper-left source diffusion region 22 is electrically connected to the bit line BL28a, the lower-left source diffusion region 23 is electrically connected to the bit line BL28b, the upper-right source diffusion region 25 is electrically connected to the bit line BL28c, and the lower-right source diffusion region 26 is electrically connected to the bit line BL28d. The gate layers 21, 24 are substantially arranged symmetrically about the center line of the drain diffusion region 20. The gate layer 21 is electrically connected to VG1 and the gate layer 24 is electrically connected to VG2, where VG1 and VG2 are both connected to a control voltage bus. Thus, VG1=VG2 all the time. The potentials VG1, VG2 are normally set at a low level but are increased to a high level during operation of the bit-line pull-up circuit.

The drain diffusion region 20 has at least two recessed diffusion edges which coincide with the protruding edge 290 of a spacer 291 on an insulating field oxide layer 29. Of the two spacers 291, one separates the upper-left source diffusion region 22 and lower-left source diffusion region 23 and extends through underneath the gate layer 21 to penetrate underneath the drain diffusion region 20, extending beyond the gate layer 21 by a length S. The other spacer 291 separates the upper-right source diffusion region 25 and the lower-right source diffusion region 26 and extends through underneath the gate layer 24 to penetrate underneath the drain diffusion region 20, extending beyond the gate layer 24 by the same length S. The provision of the recessed diffusion edges prevents the so-called electrical field crowding effect and also provides enhanced ESD immunity for the MOS transistor.

Figure 1:
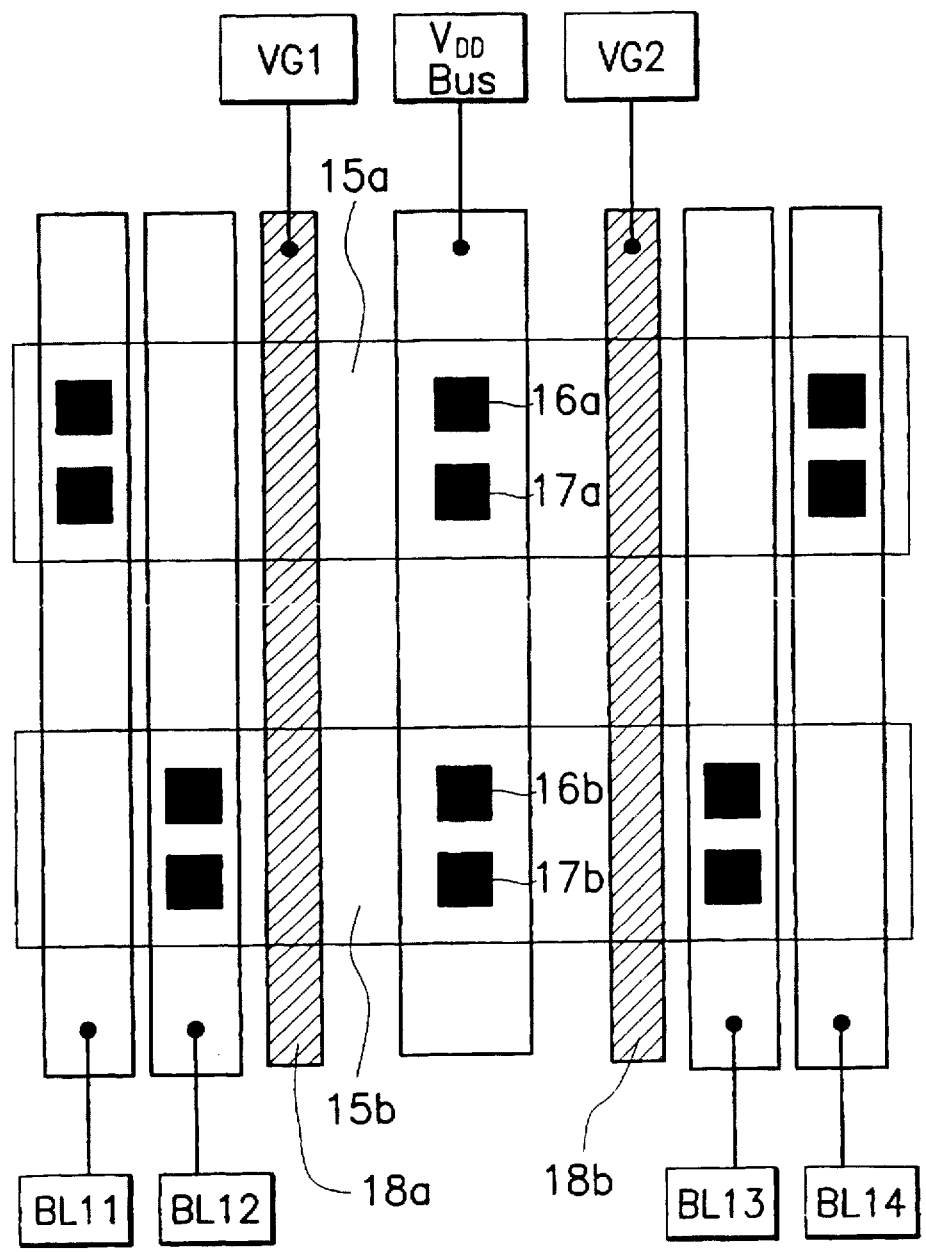
FIG. 1 is a plan view of the circuit layout of a conventional bit-line pull-up circuit for an SRAM device.

Further, since the drain diffusion region 20 is an undivided area, a greater number of metal contact windows (such as the six metal contact windows 27a, 27b, 27c, 27d, 27e, 27f disclosed here, compared to the four shown in the conventional circuit layout of FIG. 1) can be provided therein. Of these metal contact windows 27a, 27b, 27c, 27d, 27e, 27f, at least one, for example the metal contact window 27d, an be arranged substantially between the two recessed diffusion edges (that is, between the two protruding edges 290). In the event of an electrostatic discharge, this allows the discharge current flowing into the drain to be divided into a greater number of small-magnitude currents flowing to the source. The bit-line pull-up circuit thus provides enhanced ESD immunity.

In order to allow the maximum level of ESD immunity for the bit-line pull-up circuit, the separating distance between the metal contact windows 27a, 27b, 27c, 27d, 27e, 27f and the edge of the drain diff-usion region 20 should be as large as possible. However, since the chip area for circuit layout is limited, the length S, which is the distance between the recessed diffusion edges (or, correspondingly, the protruding edge 290) and the inner edge of the gate layers 21, 24, is usually minimized. Empirical data show that the elements in the bit-line pull-up circuit are preferably sized as follows:

(1) The four MOS transistors each have a channel length of about 0.6 μm;

(2) The minimum distance from the recessed diffusion edge (or, correspondingly, the protruding edge 290) to the metal contact windows 27a, 27b, 27c, 27d, 27e, 27f is about 2.0 μm;

(3) The minimum distance from the metal contact windows 27a, 27b, 27c, 27d, 27e, 27f to the top and bottom edges of the drain diffusion region 20 is also about 2.0 μm;

(4) The minimum distance from the metal contact windows 27a, 27b, 27c, 27d, 27e, 27f to the inner edges of the gate layers 21, 24 is about 2.3 μm; and (5) the length S is about 0.3 μm.

In accordance with the foregoing layout scheme, the drain diffusion region 20, which is connected to the power bus $V_{DD}$, can be provided with a greater number of metal contact windows (that is, the six metal contact windows 27a, 27b, 27c, 27d, 27e, 27f compared to the only four metal contact windows 16a, 17a, 16b, 17b in the conventional circuit layout shown in FIG. 1), so as to increase the ESD immunity of the bit-line pull-up circuit. These metal contact windows 27a, 27b, 27c, 27d, 27e, 27f, nonetheless, maintain a good separating distance from the edge of the drain diffusion region 20.

Figure 3:
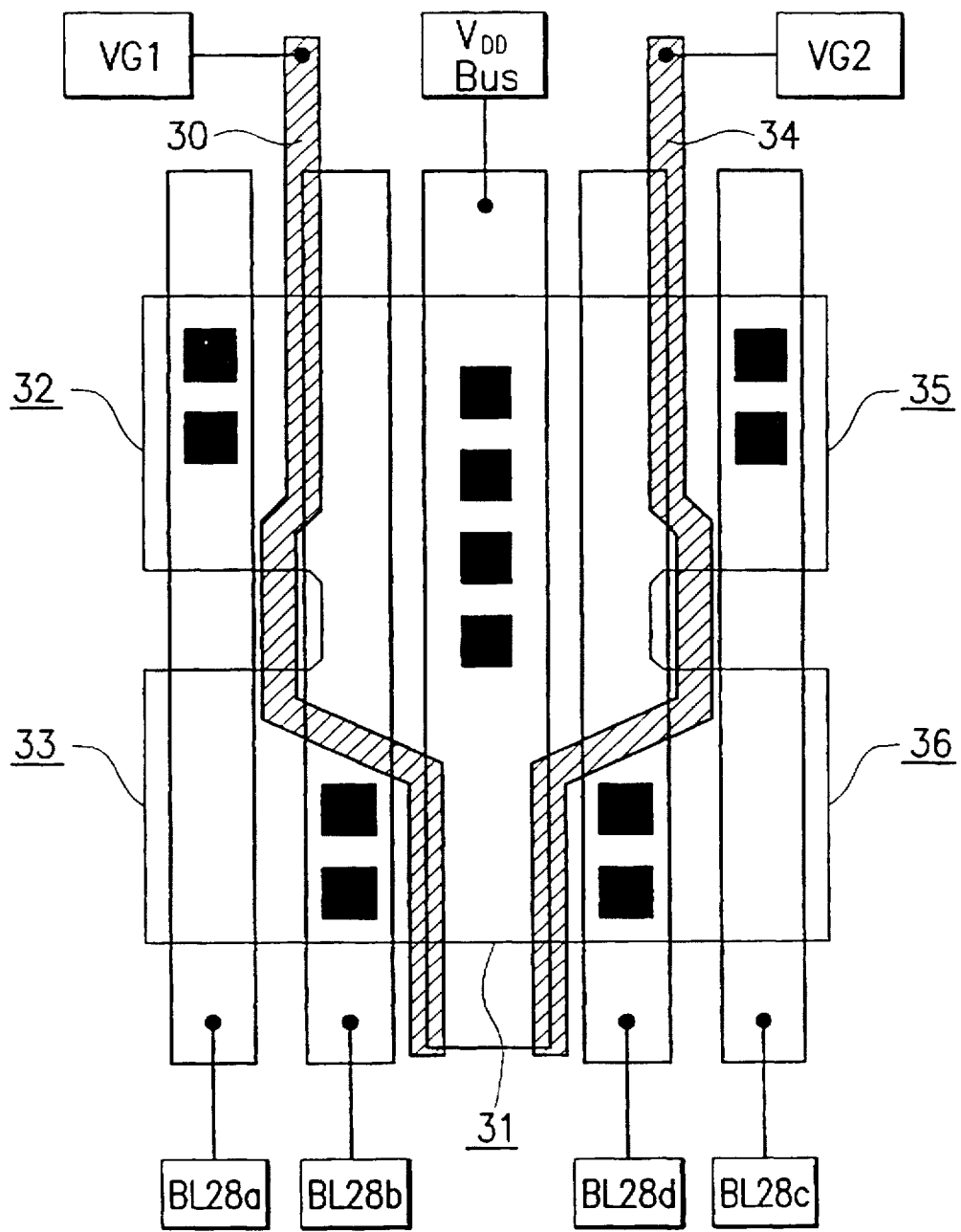
FIG. 3 is a plan view of a circuit layout of a second preferred embodiment of the bitline pull-up circuit according to the invention.

Referring to FIG. 3, there is shown a plan view of a circuit layout of a second preferred embodiment of the bit-line pull-up circuit according to the present invention. This embodiment differs from the previous embodiment in that the gate layers (here labeled with the reference numerals 30, 34) are bent with several turns, for optimal utilization of the circuit layout. Other elements and arrangements are substantially the same as in the first embodiment so that description thereof will not be repeated.

As illustrated in FIG. 3, the gate layer 30 is bent into multiple straight segments which extend in a crooked fashion over the drain diffusion region 31 and the source diffusion regions 32, 33. That is, each of the straight segments is askew with respect to an adjacent connecting segment. In a symmetrical manner, the gate layer 34 is bent into multiple straight segments which extend in a crooked fashion over the drain diffusion region 31 and the source diffusion regions 35, 36. The benefit of designing the gate layers 30,34 in a crooked manner is that the overall area needed for the circuit layout can be reduced while maintaining satisfactory distances between the metal contact windows and the gate layers. This in turn increases the packing density of the IC chip and also decreases the manufacturing cost.

Given a limited chip area for a circuit layout, an approach to increasing the distance between the metal contact windows and the edge of the gate layers is not to allow the field oxide layer to extend to the top of the common $V_{DD}$-connected diffusion region. Two examples of this approach are respectively demonstrated in the third embodiment shown in FIG. 4 and the fourth embodiment shown in FIG. 5.

Figure 4:
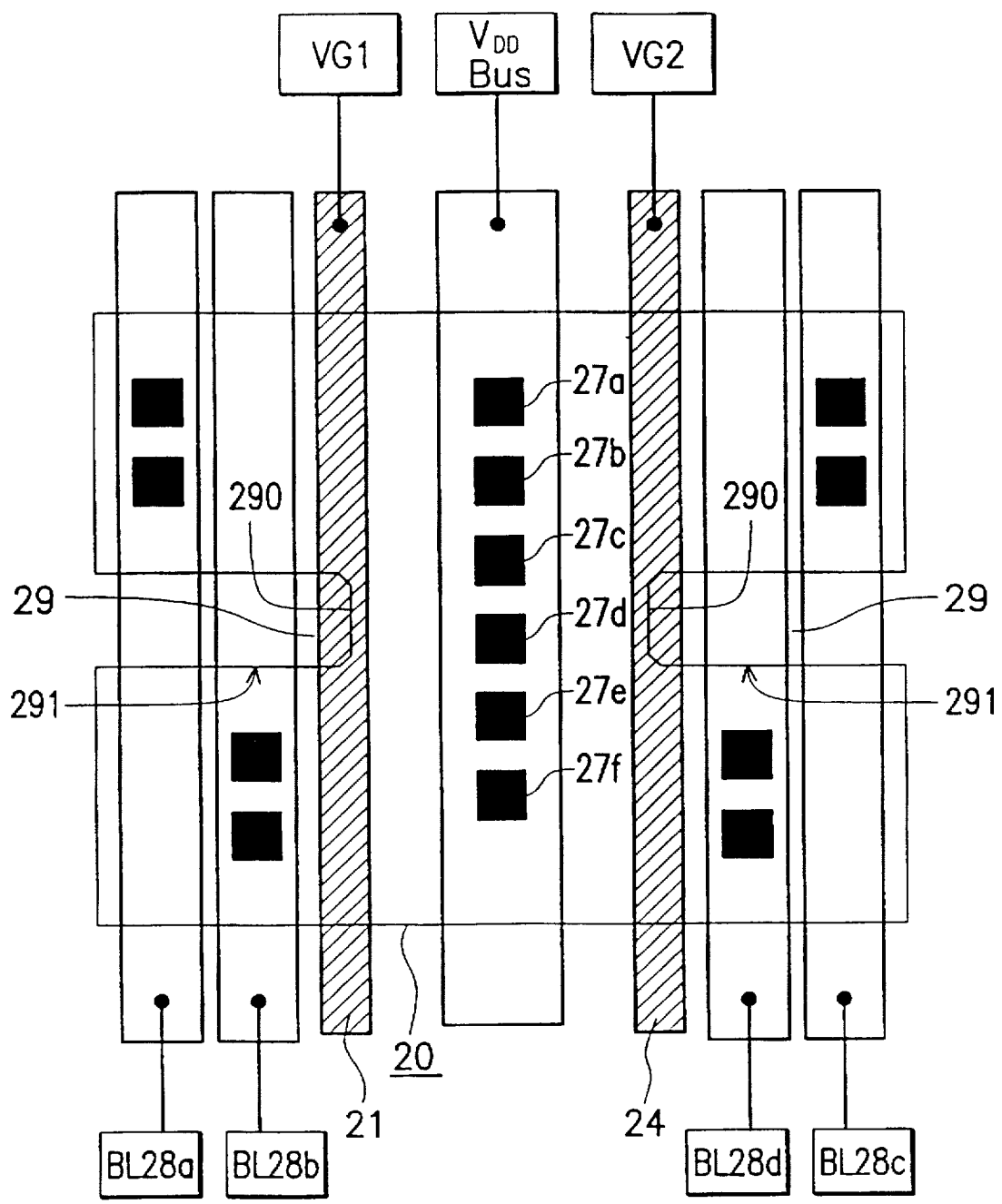
FIG. 4 is a plan view of a circuit layout of a third preferred embodiment of the bit-line pull-up circuit according to the invention.

Referring to FIG. 4, there is shown a plan view of a circuit layout of a third preferred embodiment of the bit-line pull-up circuit according to the invention. This embodiment differs from the first embodiment particularly in the manner in which the recessed diffusion edges are formed. Other elements and the arrangements thereof are substantially the same as in the first embodiment shown in FIG. 2.

As shown in FIG. 4, the recessed diffusion edges (or, correspondingly, the protruding edge 290 of the spacer 291) are formed directly beneath the gate layers 21, 24. This formation allows the distance between the metal contact windows 27a, 27b, 27c, 27d, 27e, 27f and the inner edge of the gate layers 21, 24 to be reduced, for example, from 2.3 µm in the first embodiment to 2.0 µm in this embodiment. The sizes of the elements in the bit-line pull-up circuit can thus be made smaller, as summarized in the following:

(1) The distance between the protruding edge 290 of the spacer 291 and the inner edge of the gate layers 21, 24 is in the range of from about 0 µm to 0.2 µm;

(2) The four MOS transistors each have a channel length of about 0.5 µm;

(3) The minimum distance from the metal contact windows 27a, 27b, 27c, 27d, 27e, 27f to the top and bottom edges of the drain diffusion region 20 is also about 2.0 µm; and (4) The minimum distance from the metal contact windows 27a, 27b, 27c, 27d, 27e, 27f to the inner edges of the gate layers is about 2.0 .m.

As disclosed in the foregoing, the distance between the protruding edges 290 of the spacers 291 and the inner edges of the gate layers 21, 24 is preferably 0 µm (that is, they coincide exactly). If the protruding edges 290 recede inward such that they are beneath the gate layers 21, 24, the recession will cause a reduction in the conductive reactance of the gate layers 21, 24. However, the reduction is tolerable if the recession is no greater than about 0.2 µm.

Figure 5:
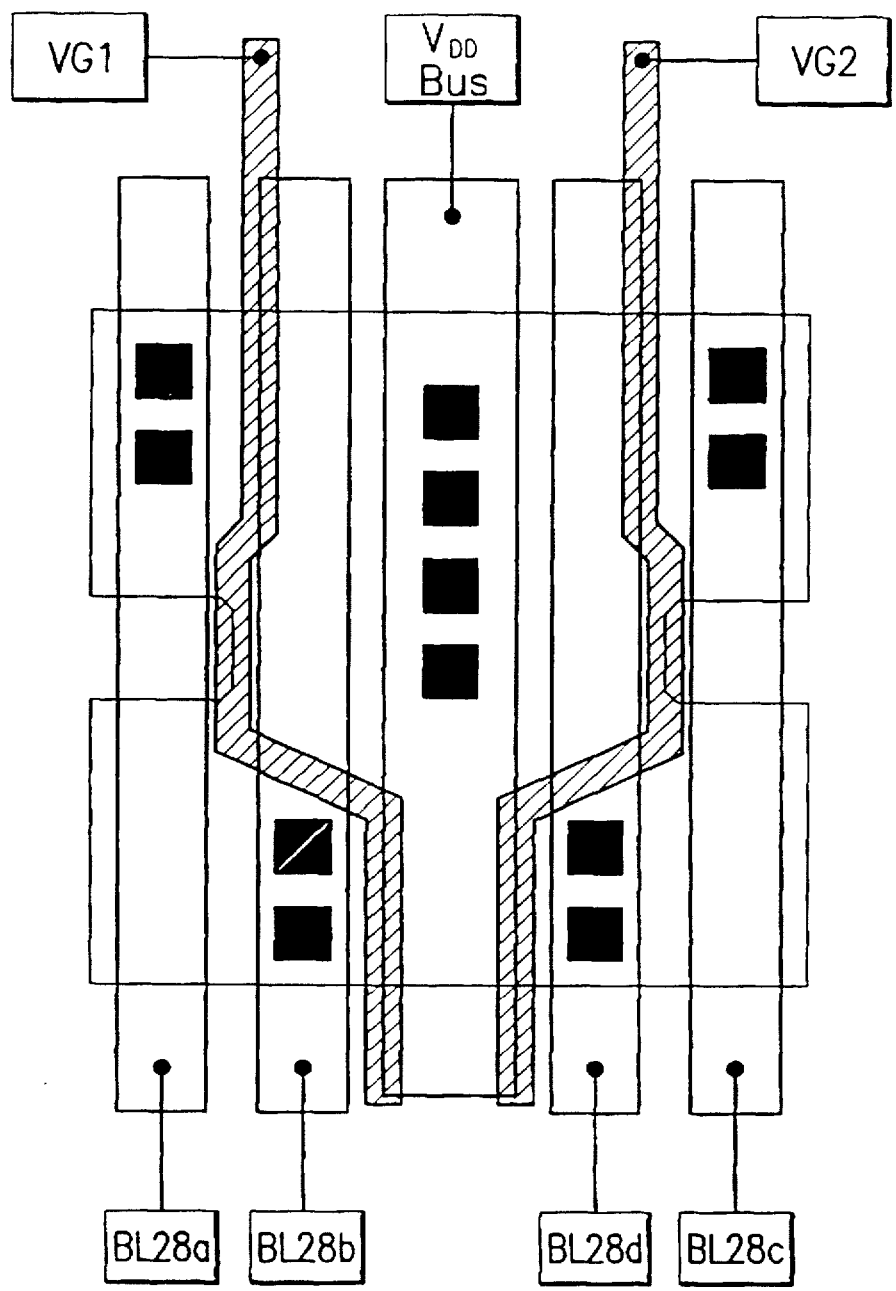
FIG. 5 is a plan view of a circuit layout of a fourth preferred embodiment of the bitline pull-up circuit according to the invention.

Referring to FIG. 5, there is shown a plan view of a circuit layout of the fourth preferred embodiment of the bit-line pull-up circuit according to the invention. The bit-line pull-up circuit disclosed here is substantially the same in structure as the second embodiment shown in FIG. 3, except that the recessed diffusion edges here are located directly beneath the gate layers. The benefit of this arrangement is the same as described in the foregoing.

Figure 6:
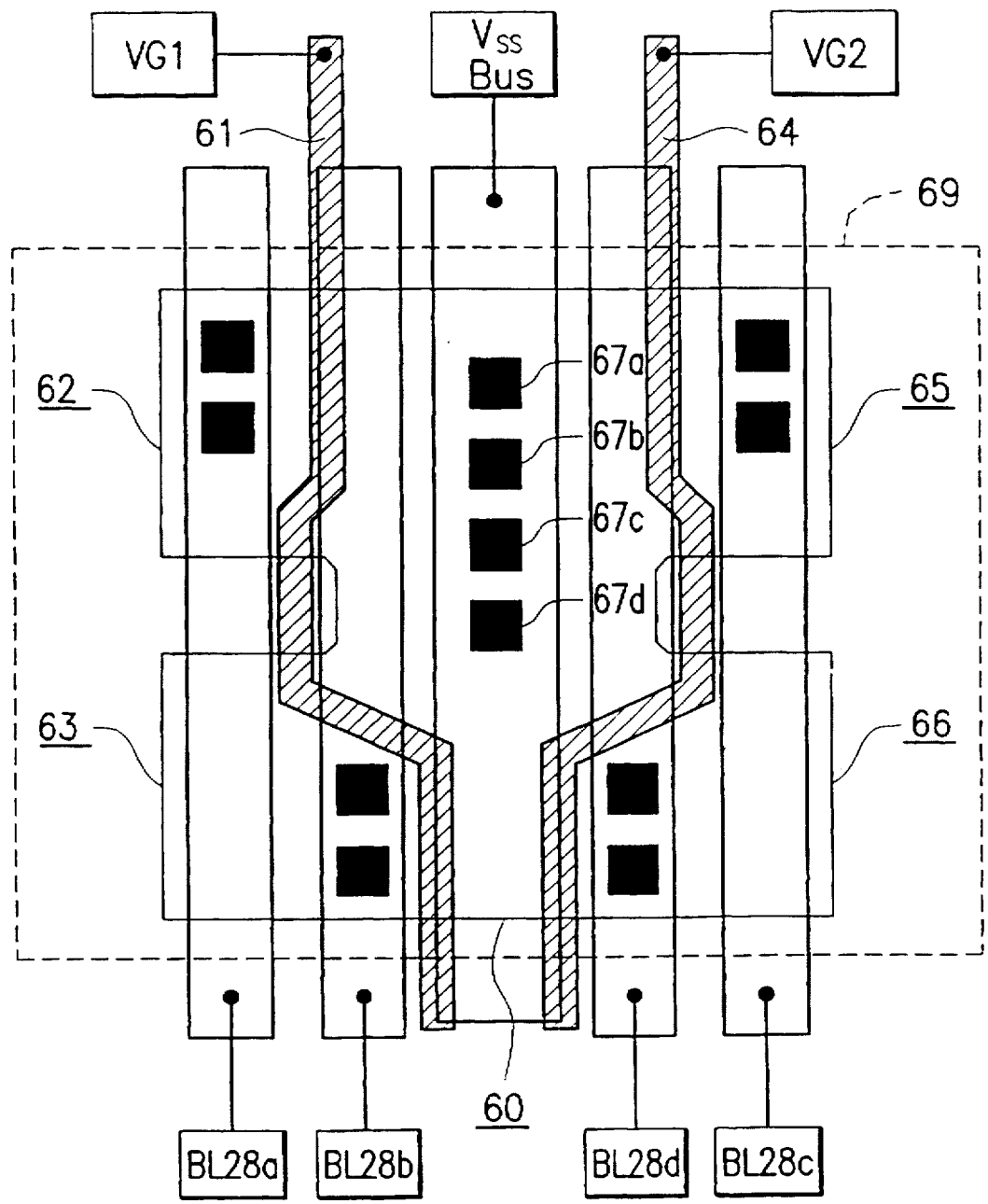
FIG. 6 is a plan view of a circuit layout of a fifth preferred embodiment of a bit-line pull-down circuit according to the invention.

FIG. 6 shows a plan view of a circuit layout of a fifth preferred embodiment of a bit-line pull-down circuit according to the present invention. The bit-line pull-down circuit is so named because the N-type MOS transistors utilized in the previous embodiments are here replaced by P-type MOS transistors. Other than this difference, the circuit layout and structure of this embodiment are substantially the same as those of the second embodiment shown in FIG. 3.

The circuit layout of FIG. 6 includes one drain diffusion region 60, four source diffusion regions 62, 63, 65, 66, and two gate layers 61, 64 extending in a crooked manner over the drain diffusion region 60. In this bit-line pull-down circuit, the drain and source diffusion regions 60, 62, 63, 65, 66 are all $p^+$-type diffusion regions. These elements define four P-type MOS transistors, the channels of which are controlled by potentials applied to the gate layers 61, 64. That is, the drain diffusion region 60, the gate layer 61, and the upper-left source diffusion region 62 in combination form a first P-type MOS transistor; the drain diffusion region 60, the gate layer 61, and the lower-left source diffusion region 63 in combination form a second P-type MOS transistor; the drain diffusion region 60, the gate layer 64, and the upper-right source diffusion region 65 in combination form a third P-type MOS transistor; and the drain diffusion region 60, the gate layer 64, and the lower-right source diffusion region 66 in combination form a fourth P-type MOS transistor.

The drain diffusion region 60 is electrically connected to a power bus $V_{SS}$ by means of a plurality of metal contact windows 67a, 67b, 67c, 67d. The four source diffusion regions 62, 63, 65, 66 are separate regions electrically connected to respective bit lines. The upper-left source diffusion region 62 is electrically connected to the bit line BL28a, the lower-left source diffusion region 63 is electrically connected to the bit line BL28b, the upper-right source diffusion region 65 is electrically connected to the bit line BL28c, and the lower-right source diffusion region 66 is electrically connected to the bit line BL28d. The gate layers 61, 64 are arranged substantially symmetrically about the center line of the drain diffusion region 60. Since the MOS transistors are P-type in this embodiment, the drain and source diffusion regions 60, 62, 63, 65, 66 are formed in an n-well indicated by the dashed box 69.

Since the drain diffusion region 60 is an undivided area, a greater number of metal contact windows can be provided, such as the four metal contact windows 67a, 67b, 67c, 67d shown in FIG. 6. Of these metal contact windows 67a, 67b, 67c, 67d, at least one, for example the metal contact window 67d, can be arranged substantially between the two recessed diffusion edges. The allows, in the event of an electrostatic discharge, the discharge current flowing into the drain to be divided into a greater number of small-magnitude currents flowing to the source. The bit-line pull-down circuit thus provides enhanced ESD immunity.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A bit-line pull-up circuit for an SRAM device having a plurality of bit lines and at least a power bus and a control voltage bus, said bit-line pull-up circuit comprising:

(a) a drain diffusion region having a pair of recessed diffusion edges formed on opposite sides thereof;

(b) a plurality of metal contact windows for electrically connecting said drain diffusion region to the power bus, wherein at least one of said metal contact windows is disposed substantially between the pair of recessed diffusion edges;

(c) a plurality of source diffusion regions, each electrically connected to one of the bit lines; and (d) at least a pair of gate layers arranged substantially symmetrically about a center line of the drain diffusion region and electrically coupled to the control voltage bus;

wherein said drain diffusion region, said gate layers, and said plurality of source diffusion regions in combination form a plurality of MOS transistors, in which said drain diffusion region serves as a common drain for said plurality of MOS transistors.

2. The bit-line pull-up circuit of claim 1, wherein each said source diff-usion region and said drain diffusion region are $n^+$-type diffusion regions.

3. The bit-line pull-up circuit of claim 1, wherein each said recessed diffusion edge is separated from one edge of a corresponding one of said gate layers by a specific distance.

4. The bit-line pull-up circuit of claim 1, wherein said gate layers are arranged substantially in parallel with the bit lines.

5. The bit-line pull-up circuit of claim 1, wherein the bit lines are formed of multiple segments arranged in a crooked manner.

6. A bit-line pull-up circuit for an SRAM device having a plurality of bit lines and at least a power bus and a control voltage bus, said bit-line pull-up circuit comprising:

(a) a drain diffusion region having at least a pair of recessed diffusion edges formed on opposite sides thereof;

(b) a plurality of metal contact windows for electrically connecting said drain diffusion region to the power bus;

(c) a plurality of source diffusion regions, each electrically connected to one of the bit lines;

(d) at least a pair of gate layers arranged substantially symmetrically about a center line of the drain diffusion region and electrically connected to the control voltage bus; and (e) a field oxide region including at least a pair of spacers, each said spacer separating one adjacent pair of said plurality of source diffusion regions, each said spacer having a protruding edge terminating beneath one of said gate layers;

wherein said drain diffusion region, said gate layers, and said plurality of source diffusion regions in combination form a plurality of MOS transistors, in 4 which said drain diffusion region serves as a common drain for said plurality of MOS transistors.

7. The bit-line pull-up circuit of claim 6, wherein said recessed diffusion edges are located beneath said gate layers.

8. The bit-line pull-up circuit of claim 6, wherein each said source diffusion region and said drain diff-usion region are $n^+$-type diffusion regions.

9. The bit-line pull-up circuit of claim 6, wherein said gate layers are arranged substantially in parallel with the bit lines.

10. The bit-line pull-up circuit of claim 6, wherein the bit lines are formed of multiple segments arranged in a crooked manner.

11. The bit-line pull-up circuit of claim 6, wherein each of said spacers extends below one of said gate layers to penetrate said drain diffusion region to a specific distance.

12. The bit-line pull-up circuit of claim 6, wherein at least one of said metal contact windows is located substantially between said recessed diffusion edges.

13. A bit-line pull-down circuit for an SRAM device having a plurality of bit lines and at least a power bus and a control voltage bus, said bit-line pull-down circuit comprising:

(a) an n-well;

(b) a drain diffusion region formed in said n-well, said drain diffusion region having at least a pair of recessed diffusion edges formed on opposite sides thereof;

(c) a plurality of metal contact windows for electrically connecting said drain diffusion region to the power bus;

(d) a plurality of source diffusion regions formed in said n-well, each electrically connected to one of the bit lines;

(e) at least a pair of gate layers arranged substantially symmetrically about a center line of the drain diffusion region and electrically connected to the control voltage bus; and (f) a field oxide region including at least a pair of spacers, each said spacer separating one adjacent pair of said plurality of source diffusion regions, each said spacer having a protruding edge which coincides with a corresponding one of said recessed diffusion edges and terminates beneath one of said gate layers;

wherein said drain diffusion region, said gate layers, and said plurality of source diffusion regions in combination form a plurality of MOS transistors, in which said drain diffusion region serves as a common drain for said plurality of MOS transistors.

14. The bit-line pull-down circuit of claim 13, wherein each of said spacers extends below one of said gate layers to penetrate said drain diffusion region to a specific distance.

15. The bit-line pull-down circuit of claim 13, wherein at least one of said metal contact windows is located substantially between said recessed diffusion edges.

16. The bit-line pull-down circuit of claim 13, wherein each said source diffusion region and said drain diffusion region are $p^+$-type diffusion regions.

17. The bit-line pull-down circuit of claim 13, wherein said gate layers are arranged substantially in parallel with the bit lines.

18. The bit-line pull-down circuit of claim 13, wherein said recessed diffusion edges are located beneath said gate layers.

19. The bit-line pull-down circuit of claim 13, wherein the bit lines are formed of multiple segments arranged in a crooked manner.

20. The bit-line pull-down circuit of claim 13, wherein each of said spacers extends below one of said gate layers to an edge of said one of said gate layers.

21. The bit-line pull-down circuit of claim 13, wherein at least one of said metal contact Windows is located substantially between said spacers.

* * * * *